(12) United States Patent
Song et al.

(10) Patent No.: US 7,646,225 B2
(45) Date of Patent: Jan. 12, 2010

(54) MAINS PHASE DETECTION APPARATUS

(75) Inventors: Chaosheng Song, Shanghai (CN); Gang Gou, Shanghai (CN)

(73) Assignee: Miartech, Inc., Shanghai (CN)

( * ) Notice: Subject to any disclaimer, the term of this patent is extended or adjusted under 35 U.S.C. 154(b) by 0 days.

(21) Appl. No.: 12/093,532

(22) PCT Filed: Nov. 16, 2006

(86) PCT No.: PCT/CN2006/003082
§ 371 (c)(1),
(2), (4) Date: Aug. 18, 2008

(87) PCT Pub. No.: WO2007/056950
PCT Pub. Date: May 24, 2007

(65) Prior Publication Data
US 2008/0309376 A1 Dec. 18, 2008

(30) Foreign Application Priority Data
Nov. 16, 2005 (CN) .................... 2005 1 0110391

(51) Int. Cl.
*H03L 7/06* (2006.01)
(52) U.S. Cl. ......................... 327/156; 327/147
(58) Field of Classification Search ......... 327/144–147, 327/154–156; 375/375, 376
See application file for complete search history.

(56) References Cited

U.S. PATENT DOCUMENTS

| 5,485,484 | A | * | 1/1996 | Williams et al. ............ 375/376 |
| 5,539,346 | A | * | 7/1996 | Goto .......................... 327/156 |
| 5,590,157 | A | | 12/1996 | Schuur |
| 6,956,924 | B2 | * | 10/2005 | Linsky et al. ............... 375/376 |
| 7,394,884 | B2 | * | 7/2008 | Kaylani et al. .............. 375/372 |
| 2003/0062955 | A1 | | 4/2003 | Lee et al. |

FOREIGN PATENT DOCUMENTS

| CN | 1396710 | 2/2003 |
| EP | 1422827 | 5/2004 |

* cited by examiner

*Primary Examiner*—Lincoln Donovan
*Assistant Examiner*—Hai L Nguyen
(74) *Attorney, Agent, or Firm*—Quarles & Brady LLP

(57) ABSTRACT

The present invention relates to an apparatus for accurately detecting a mains phase. The apparatus is constructed with a zero-crossing detector, a digital phase detector, a digital loop filter, and a digital controlled oscillator (DCO) of a direct digital synthesized (DDS) manner. The present apparatus employs an all-digital loop architecture and a high sampling clock to recover a signal with a phase orthogonal with the mains signal and a frequency the same as the mains signal. And jitters in the recovered signal are less than 10 us. The present apparatus is capable of implementing signal tracking of a zero frequency error and a zero phase in a wide range, and can provide a detection result of excellent performance for the power line carrier communication, mains frequency detection, etc.

5 Claims, 5 Drawing Sheets

MAINS PHASE DETECTION APPARATUS

CROSS REFERENCE TO RELATED APPLICATIONS

This application represents the national stage application of International Application PCT/CN2006/003082, filed 16 Nov. 2006, which claims the benefit of Chinese Patent Application 200510110391.3, filed 16 Nov. 2005, which is incorporated herein by reference in its entirety for all purposes.

TECHNICAL FIELD

The present invention relates to a phase detection apparatus, more particularly to a mains phase detection apparatus.

BACKGROUND OF THE INVENTION

It is required to detect the phase/frequency of a power line in various application fields, such as mains frequency monitoring, phase-controlled rectification, and mains phase detection in a power line carrier communication.

A zero-crossing detection method is employed by conventional mains phase/frequency detection, i.e., a zero-crossing point is detected by a comparator, and a cycle and a frequency of the mains are then obtained by calculating the time interval between zero-crossing points. Such method has the advantage of a high detecting speed, simplicity and reliability. However, since there is a large amount of noise and interference on the power line, the appearing time of the zero-crossing points will be affected, which thus causes it is impossible to obtain a detecting result with a high precision from such a simple zero-crossing detection method.

SUMMARY OF THE INVENTION

The present invention provides a mains phase detection apparatus to overcome the deficiencies existing in the prior art. The detection apparatus is capable of effectively improving the detection precision for the mains phase.

In the mains phase detection apparatus of the present invention, an all-digital phase-locked loop with a high precision is added after a zero-crossing detector to provide a detection performance with an extremely high precision.

The present invention provides a mains phase detection apparatus including a zero-crossing detector and an all-digital phase-locked loop. The all-digital phase-locked loop includes a digital phase detector, a digital loop filter and a digital controlled oscillator which are sequentially coupled. An output terminal of the digital controlled oscillator and an output terminal of the zero-crossing detector are connected to an input terminal of the digital phase detector.

In the mains phase detection apparatus, the digital phase detector includes an exclusive-OR gate.

In the mains phase detection apparatus, the digital loop filter includes: an accumulator, a proportion regulator, an integrator, a first adder, and a second adder. An input terminal of the accumulator is connected to an output terminal of the digital phase detector. Input terminals of the proportion regulator and the integrator are connected to an output terminal of the accumulator. Two input terminals of the first adder are connected to output terminals of the proportion regulator and the integrator, respectively. The second adder has two input terminals, one input terminal thereof is connected to an output terminal of the first adder, and the other input terminal thereof is set with an initial frequency word.

In the mains phase detection apparatus, the initial frequency word corresponds to a frequency between 53~57 Hz.

In the mains phase detection apparatus, the initial frequency word corresponds to a frequency of 55 Hz.

The mains phase detection apparatus further includes a rising edge detector that is triggered by a rising edge of an output signal of the zero-crossing detector to generate a detecting pulse. The rising edge detector outputs the detecting pulse to the accumulator of the loop filter. The accumulator is reset responsive to the detecting pulse, and accumulates an output signal of the phase detector between two of the detecting pulses.

In the mains phase detection apparatus, the digital controlled oscillator includes a phase accumulator. An input terminal of the phase accumulator is connected to an output terminal of the digital loop filter. The MSB (Most Significant Bit) of the phase accumulator is an output signal output to the digital phase detector.

BRIEF DESCRIPTION OF THE ACCOMPANY DRAWINGS

The features and performances of the present invention will be further described through the following embodiments and in conjunction with the accompany drawings, in which.

DETAILED DESCRIPTION OF THE INVENTION

Figure 1:
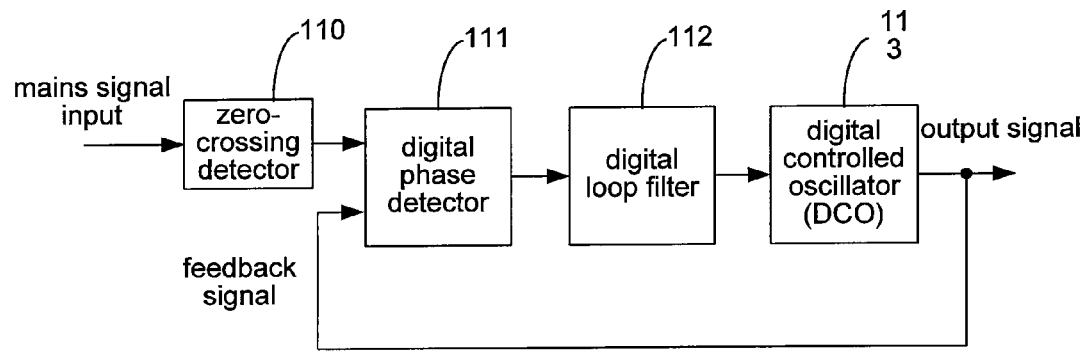
FIG. 1 is a block diagram of a mains phase detection apparatus of the present invention.

Please refer to FIG. 1, a mains phase detection apparatus of the present invention includes a zero-crossing detector 110, and an all-digital phase-locked loop constructed with a digital phase detector 111, a digital loop filter 112 and a digital controlled oscillator 113. Firstly, an analog signal obtained by sampling the mains is shaped by the zero-crossing detector (comparator) 110. Thus, the mains signal is converted from a sinusoidal wave with distortion to a square signal, which is sampled then by a clock signal to generate a 1 bit digital signal. The digital phase detector 111 of the phase-locked loop implement a phase comparison between an external input digital signal and an output signal of the digital controlled oscillator 113 (typically performed by a component with multiplication characteristics). The digital loop filter 112 implements low-pass filtering to generate an error control signal for adjusting the frequency of the output signal of the digital controlled oscillator 113, thus to make it have a zero phase difference with the input signal. Since the all-digital phase-locked loop has an accurate phase tracking functionality, a detection performance with an extremely high precision can be achieved by applying it in the mains phase detection.

In an embodiment of FIG. 1, the zero-crossing detector 110 may be implemented using a conventional technique. The internal architecture thereof is thus not further described herein. People skilled in the art may implement it utilizing a conventional technique or prior art according to the previous description.

Figure 2:
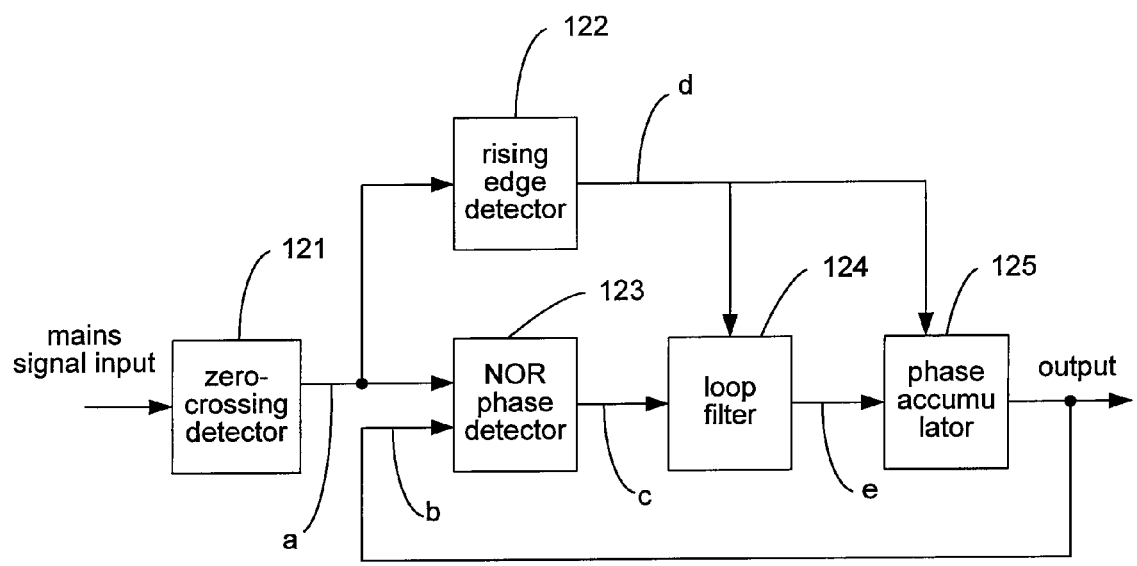
FIG. 2 is a block diagram of a preferred embodiment of the mains phase detection apparatus of the present invention.
Figure 6:
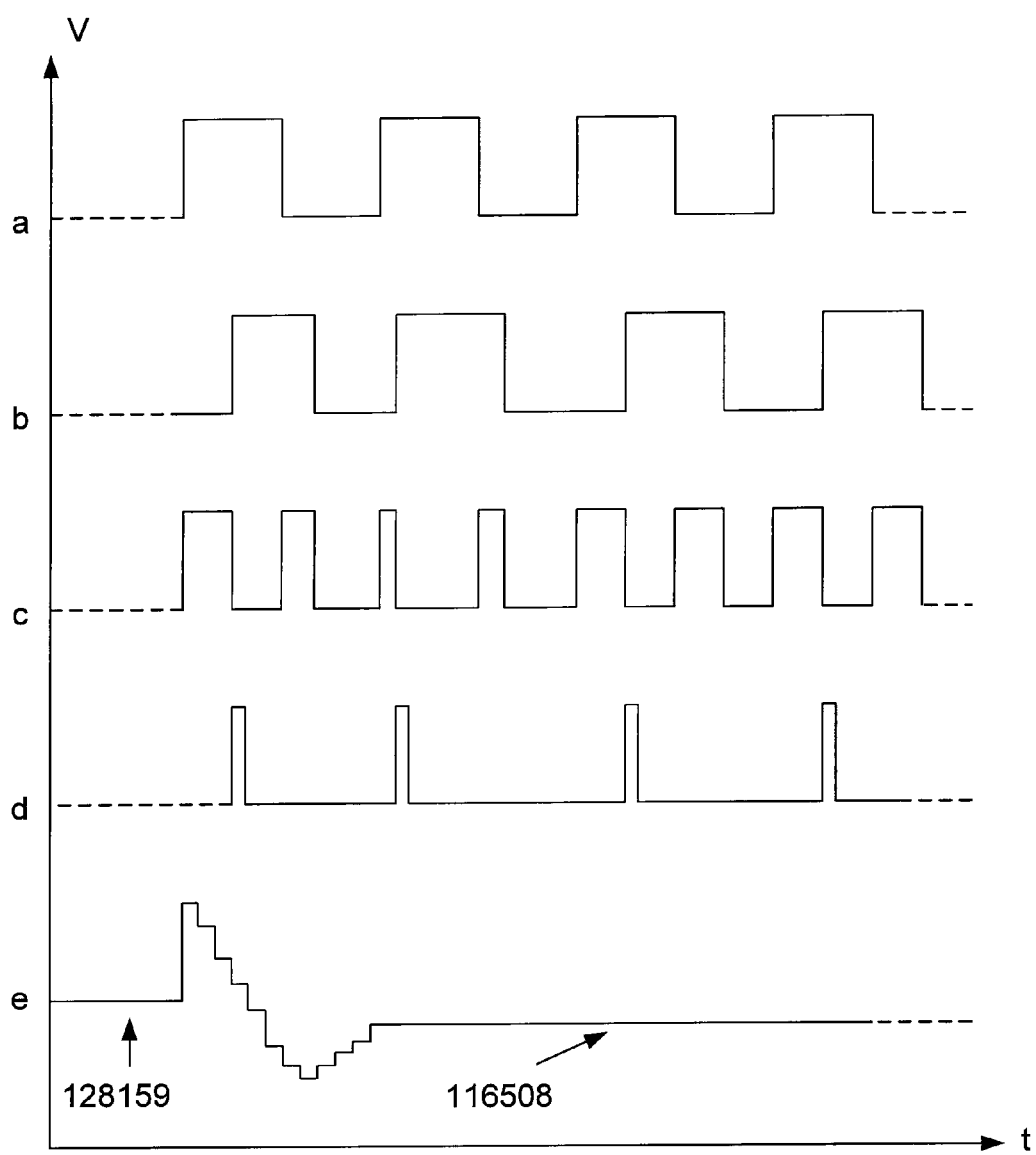
FIG. 6 is an illustrative diagram of waveforms at various points of the mains phase detection apparatus illustrated in FIG. 2.

Please refer to FIG. 6 while referring to FIG. 2. FIG. 2 is a block diagram of a preferred embodiment of the mains phase detection apparatus of the present invention. FIG. 6 is an illustrative diagram of waveforms at various points of the mains phase detection apparatus illustrated in FIG. 2. In the present embodiment, a zero-crossing detector 121 also shapes the analog signal obtained by sampling the mains, and converts the mains signal from a sinusoidal wave with distortion to a square signal, which is then sampled by a clock signal to generate a 1 bit 50 Hz digital signal a. The all-digital phase-locked loop includes a rising edge detector 122, an exclusive-OR (XOR) phase detector 123, a loop filter 124 and a phase accumulator 125 used as a digital controlled oscillator. The phase detector 123 perform phase detection upon the input signal a required to be tracked and an output signal b of the phase accumulator 125 (i.e., the digital controlled oscillator). Since the input signal a is a 1 bit digital signal and the output signal b of the phase accumulator 125 is also a square signal (can also be represented by a 1 bit signal), the multiplication operation required to be implemented by the phase detector 123 merely requires 1 bit multiplying 1-bit. Therefore, the phase detector herein may be simplified as an exclusive-OR gate. The rising edge detector 122 detects a rising edge of the output signal a, and therefore generates a detecting pulse signal d, which is used to control the operations of the loop filter 124 and the phase accumulator 125, the process of which will be described below.

Figure 3:
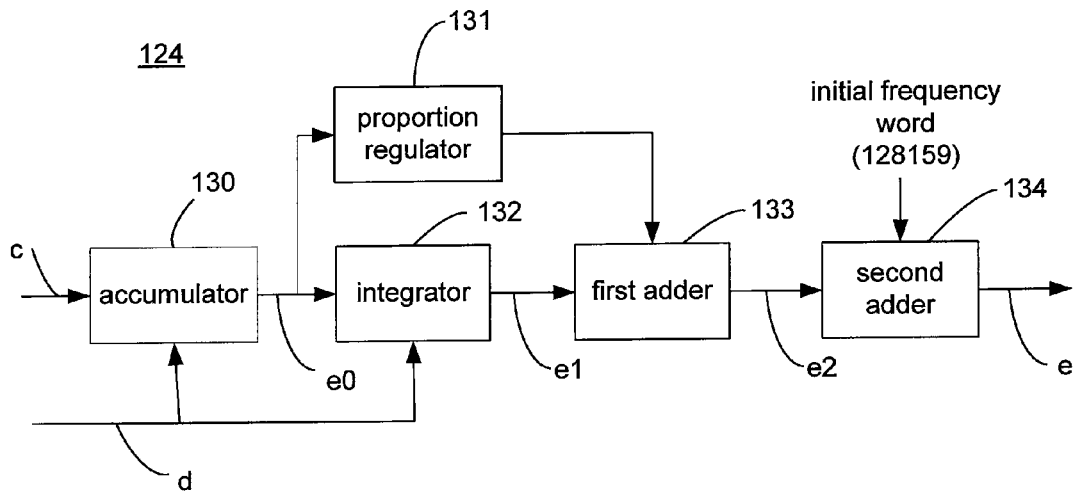
FIG. 3 is a block diagram of a loop filter of the mains phase detection apparatus illustrated in FIG. 2.
Figure 4:
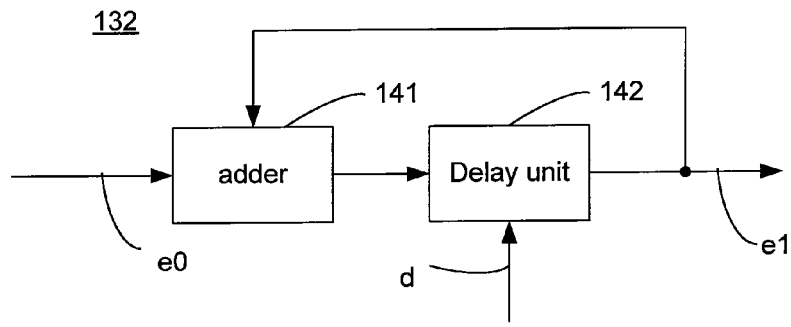
FIG. 4 is a block diagram of an integrator of the mains phase detection apparatus illustrated in FIG. 2.
Figure 7:
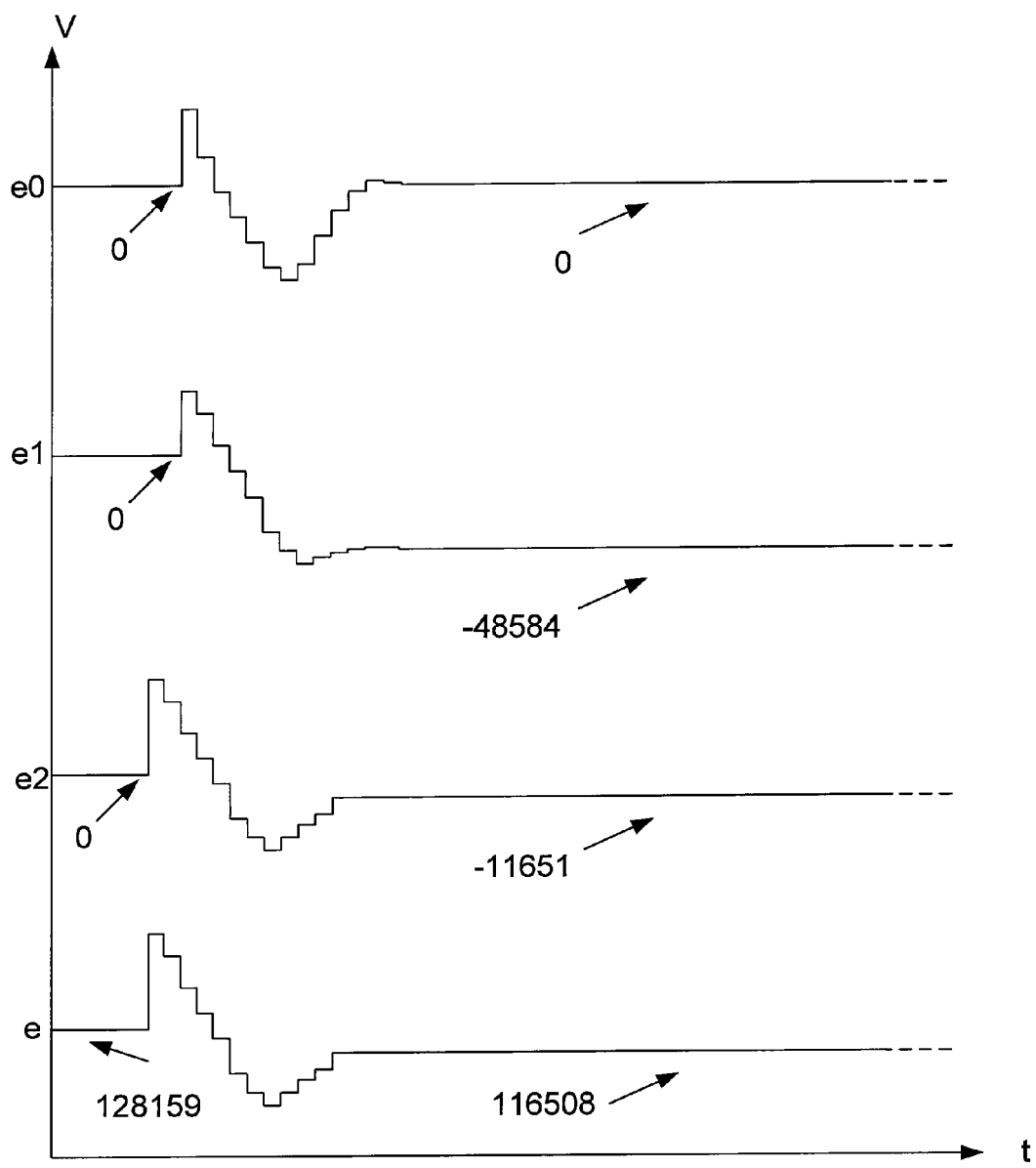
FIG. 7 is an illustrative diagram of waveforms at various points of the loop filter illustrated in FIG. 3.

Please refer to FIG. 7 while referring to FIG. 3. FIG. 3 is a block diagram of the loop filter 124 in FIG. 2, and FIG. 7 is an illustrative diagram of waveforms at various points of the loop filter illustrated in FIG. 3. The loop filter 124 is constructed with a first order loop, including an accumulator 130, a proportion regulator 131, an integrator 132, a first adder 133 and a second adder 134. An input terminal of the accumulator 130 is connected to an output terminal of the phase detector 123. The accumulator 130 is used to accumulatively account the output signal a of the phase detector 123, thus to perform the conversion from 1 bit data to data with a specific phase. The detailed accumulating process includes: at a rising edge of the output signal a of the zero-crossing detector 121, the accumulator 130 receives a detecting pulse of the rising edge detector 122 and thus is assigned an initial value (i.e., reset, the reset value is zero); the accumulator 130 then accumulates an output signal c of the phase detector 123 between two rising edges of the signal a (i.e., two detecting pulses of the rising edge detector 122), and the output signal thereof is e0. Input terminals of the proportion regulator 131 and the integrator 132 are both connected to an output terminal of the accumulator 130, wherein the proportion regulator 131 is used to weight the output signal e0 of the accumulator 130, and the integrator 132 accumulates the output signal e0 of the accumulator 130 and outputs a signal e1. The detailed accumulating process includes: at a rising edge of the output signal a, the integrator 132 receives the detecting pulse from the rising edge detector 122 and perform accumulation upon the pulse. FIG. 4 illustrates a block diagram of an embodiment of the integrator 132. The integrator 132 consists of a 19-bit adder 141 and a 19-bit delay unit 142. An input of the adder 141 is the output signal e0 of the accumulator 130, and another input is an output of the delay unit 142. At a rising edge of the output signal a, an output of the adder 141 is stored by the delay unit 142. The outputs of the integrator 132 and the proportion regulator 131 are performed an addition operation at the first adder. An operation result e2 thereof and an initial frequency word are then input into the second adder 134. An output signal e of the second adder 134 is an output of the loop filter 124.

The aforementioned initial frequency word corresponds to an initial output frequency. The phase-locked loop can utilize the initial output frequency to ultimately implement phase-locking with the input signal a required to be tracked. Since alternative currents of two frequencies including 50 Hz and 60 Hz are employed currently in the world, preferably setting an initial frequency word corresponding to an initial output frequency between 53 Hz~57 Hz can implement the phase-locking functionality for a 50 Hz or 60 Hz mains signal more simply, without configuring 50 Hz and 60 Hz initial frequency words respectively. More preferably, the initial frequency word corresponds to an initial output frequency of 55 Hz. Assume that the clock frequency in the system is 921.6 kHz and the bit-width of the phase accumulator is 31-bit, according to the formula:

$$55 \times 2^{31}/921.6/1000 \approx 128159$$

it is known that the initial frequency is 128159. The phase-locked loop with such a structure has a longer initial locking time, the specific number of which is determined by the system clock and the precision of the phase accumulator. Since there is not a very high requirement for the initial locking time in a practical system, the present structure may be employed.

Figure 5:
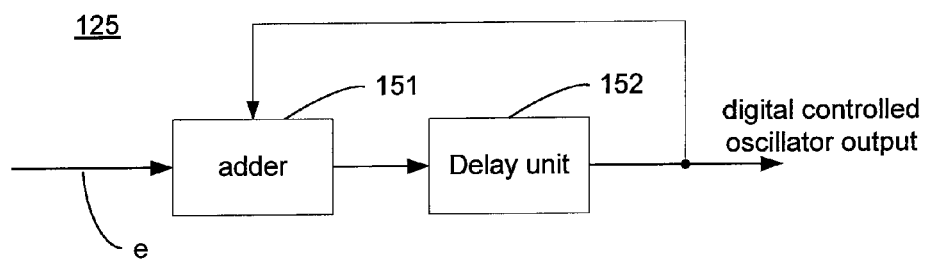
FIG. 5 is a block diagram of a phase accumulator of the mains detection apparatus illustrated in FIG. 2.
Figure 8:
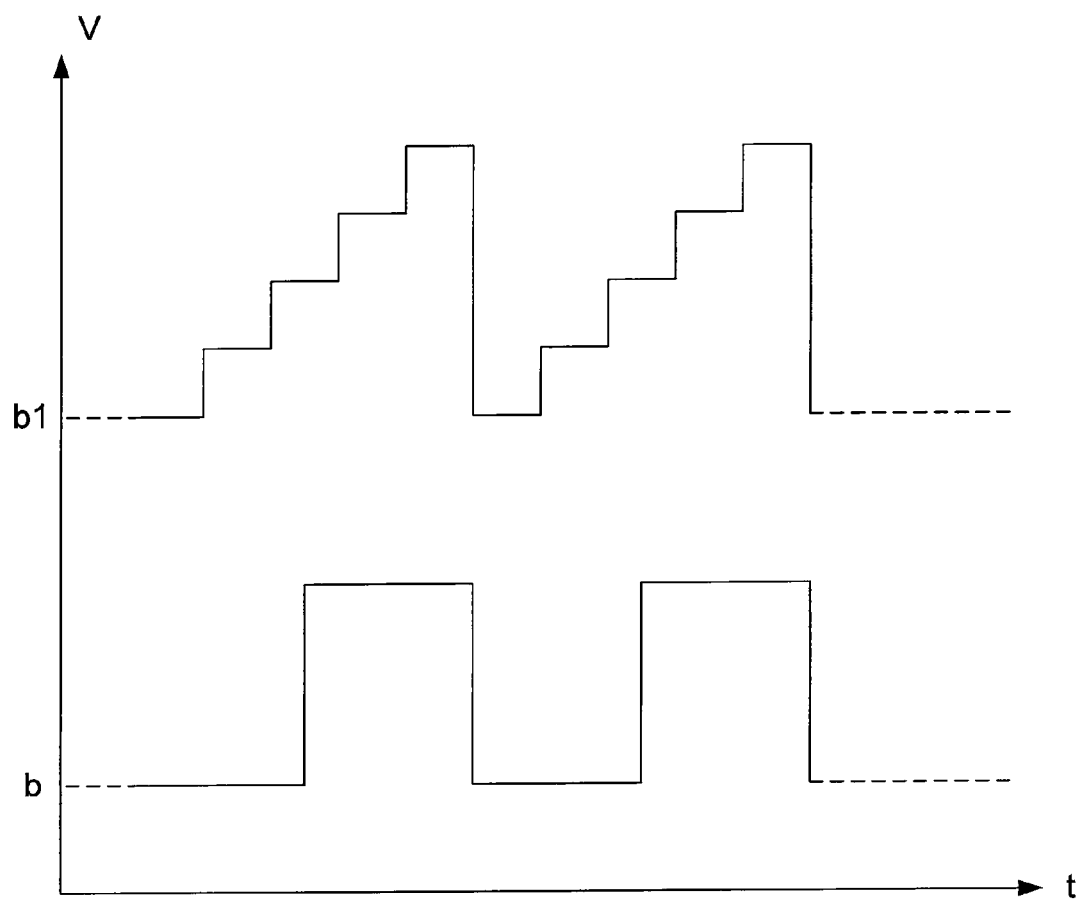
FIG. 8 is an illustrative diagram of waveforms at various points of the phase accumulator illustrated in FIG. 5.

Please refer to FIG. 8 while referring to FIG. 5. FIG. 5 is a block diagram of a phase accumulator, and FIG. 8 is an illustrative diagram of waveforms at various points of the phase accumulator illustrated in FIG. 5. The phase accumulator 125 is a DDS (direct digital synthesized) structure and employs a system clock frequency being 921.6 kHz. It employs a 31-bit accumulator that has a structure similar to the structure of the integrator 132 in the loop filter 124. The differences are that an adder 151 has a bit-width of 31-bit, and a delay unit 152 has a bit-width of 31-bit. The phase accumulator performs accumulation at each clock cycle. A circular cycle completes when the adder 151 overflows. The MSB of the adder 151 varies periodically, i.e., being the output signal b of the overall digital phase-locked loop. The phase of the output signal b is orthogonal with the input signal a required to be tracked (with a 90-degree difference).

FIG. 6 is an illustrative diagram of waveforms at various points of the mains phase detection apparatus illustrated in FIG. 2. The phase-locking process of the mains phase detection apparatus can be seen from FIG. 6. The output signal a of the zero-crossing detector 121 is a 50 Hz square signal, and the signal b is the output signal of the digital phase-locked loop. It can be seen that the frequency of the output signal b initially is not consistent with the input signal a. The signal c is the output signal of the phase detector 123. It can be seen that when the loop just begins to operate, the output of the phase detector 123 has an apparent variation, which reflects the phase difference between the input signal a and the output signal b of the phase-locked loop, and when the output signal b of the loop has a frequency consistent with the frequency of the input signal a, the output of the phase detector 123 keeps unchanged. The signal d is the output signal of the rising edge detector 122, and varies following the rising edges of the output signal a of the zero-crossing detector 123. The signal e is the output signal of the loop filter. It can be seen that when the loop begins to operate, the output of the loop filter 124 varies apparently, rather than being maintained as an approximate constant, which reflects that the loop is in a capturing period, and when the output signal b of the loop has a frequency consistent with the frequency of the input signal a, the output signal of the loop filter is approximately maintained at a fixed constant 116508 that corresponds to the input frequency 50 Hz, which illustrates that the loop has been phased-locked with the 50 Hz input signal. Accordingly, the output signal b of the digital phase-locked loop is ultimately stably output and has the same frequency as the input signal a, with a phase difference of 90-degree.

FIG. 7 further illustrates waveform outputs at various points in the operation process of the loop filter 124. The signal e0 is the output signal of the accumulator 130. The accumulator 130 accumulates the output signal c of the phase detector 123. It can be seen that when the loop just begins to operate, the output of the accumulator 130 has an apparent variation, and when the loop comes to a stable state, the output of the accumulator 130 keeps unchanged, and stabilizes at the amplitude of zero. The signal e1 is the output signal of the integrator 132, since the integrator 132 itself has a hysteresis effect, it can be seen that the output of the integrator 132 has a delay with respect to the output of the first adder 133 (including the output of the proportion regulator 131). When the loop just begins to operate, the output of the integrator 132 has an apparent variation, and when the loop comes to a stable state, the output of the integrator 132 maintains unchanged, and stabilizes at the amplitude of −48584. The signal e2 is the output signal of the first adder 133. When the loop just begins to operate, the output of the first adder 133 has an apparent variation, and when the loop comes to a stable state, the output of the first adder 133 maintains unchanged, and stabilizes at the amplitude of −11651. The signal e is the output signal of the second adder 134, i.e., the output of the loop filter 124. When the loop just begins to operate, the output of the second adder 134 has an apparent variation, and when the loop comes to a stable state, the output of the second adder 134 maintains unchanged, and stabilizes at the amplitude of 116508. It can be seen that with respect to the output of the first adder 133, the second adder 134 only has a difference of the initial frequency word 128159.

FIG. 8 illustrates waveform outputs at various points when the digital controlled oscillator is in operation. A signal b1 is the output signal of the 31-bit accumulator and varies periodically. A signal b is the MSB output signal of the accumulator, i.e., the ultimate output of the overall digital phase-locked loop, and is a square wave output.

The precision of the all-digital phase-locked loop of the present invention is determined by the bit-width of the phase accumulator 125 and the system clock. In an practical system, the clock frequency is 921.6 kHz and the phase accumulator 125 is 31-bit, thus the frequency resolution of the system is $921.6k/2^{31}=0.43\times10^{-3}$ Hz, which can satisfy the requirement of system design.

INDUSTRY APPLICABILITY

The mains phase detection apparatus of the present invention employs an all-digital loop architecture and a high frequency sampling clock to recover a signal with a phase orthogonal with that of the mains signal and a frequency the same as the mains signal. And jitters in the recovered signal are less than 10 us. Therefore, the present phase detection apparatus is capable of implementing signal tracking with a zero frequency error and a zero phase in a large range. It can provide a detection result of excellent performance for the power line carrier communication, mains frequency detection, etc. Since an all-digital manner is employed, both of the design and debug can be implemented by software. Therefore the cost is extremely decreased, and also the device consistency problem brought by employing an analog phase-locked loop can be avoided.

The invention claimed is:

1. A mains phase detection apparatus comprises a zero-crossing detector, wherein said mains phase detection apparatus further comprises:
    an all-digital phase-locked loop, wherein said all-digital phase-locked loop comprises an edge detector, a digital phase detector, a digital loop filter, and a phase accumulator,
    wherein said edge detector couples said zero-crossing detector, and is triggered by either a rising edge or a falling edge of an output signal of said zero-crossing detector to generate a detecting pulse;
    and wherein said digital phase detector couples said zero-crossing detector and said phase accumulator to generate a phase difference signal between output signals of said zero-crossing detector and said phase accumulator;
    and wherein said digital loop filter couples said edge detector and said digital phase detector to perform low-pass filtering between each two detecting pulses of said edge detector;
    and wherein said phase accumulator is coupled to said digital loop filter, wherein a most significant bit of said phase accumulator is an output signal output to said digital phase detector.

2. The mains phase detection apparatus of claim 1, wherein said digital phase detector comprises an exclusive-OR gate.

3. The mains phase detection apparatus of claim 1, wherein said digital loop filter comprises an accumulator, a proportion regulator, an integrator, a first adder, and a second adder,
    wherein an input terminal of said accumulator is coupled to an output terminal of said digital phase detector, and input terminals of said proportion regulator and said integrator are coupled to an output terminal of said accumulator; and
    wherein two input terminals of said first adder are respectively coupled to output terminals of said proportion regulator and said integrator, and said second adder has two input terminals, wherein one input terminal is coupled to an output terminal of said first adder, and the other input terminal is set with an initial frequency word, wherein said accumulator is reset responsive to said detecting pulse, and accumulates an output signal of said phase detector between two of said detecting pulses.

4. The mains phase detection apparatus of claim 3, wherein said initial frequency word corresponds to a frequency between 53~57 Hz.

5. The mains phase detection apparatus of claim 3, wherein said initial frequency word corresponds to a frequency of 55 Hz.

* * * * *